US006028322A

United States Patent [19]

Moradi

[11] Patent Number: 6,028,322

[45] Date of Patent: Feb. 22, 2000

[54] DOUBLE FIELD OXIDE IN FIELD EMISSION DISPLAY AND METHOD

[75] Inventor: Behnam Moradi, Boise, Id.

[73] Assignee: Micron Technology, Inc., Boise, Id.

[21] Appl. No.: 09/120,988

[22] Filed: Jul. 22, 1998

[51] Int. Cl.[7] .............................. H01L 29/06; H01L 29/12

[52] U.S. Cl. ............................ 257/10; 313/310; 313/311; 313/336; 445/50

[58] Field of Search .............................. 257/10; 313/310, 313/311, 336; 445/50

[56] References Cited

U.S. PATENT DOCUMENTS

| | | | |
|---|---|---|---|
| 3,814,968 | 6/1974 | Nathanson et al. | 313/95 |
| 4,940,916 | 7/1990 | Borel et al. | 313/306 |
| 5,151,061 | 9/1992 | Sandhu | 445/24 |
| 5,186,670 | 2/1993 | Doan et al. | 445/24 |
| 5,210,472 | 5/1993 | Casper et al. | 315/349 |
| 5,319,233 | 6/1994 | Kane | 257/350 |
| 5,410,218 | 4/1995 | Hush | 315/169.1 |
| 5,585,301 | 12/1996 | Lee et al. | 437/60 |
| 5,702,281 | 12/1997 | Huang et al. | 445/50 |
| 5,712,534 | 1/1998 | Lee et al. | 315/169.3 |
| 5,721,472 | 2/1998 | Browning et al. | 315/169.1 |
| 5,731,597 | 3/1998 | Lee et al. | 257/10 |
| 5,780,318 | 7/1998 | Hirano et al. | 438/20 |

OTHER PUBLICATIONS

Kamimura et al., "Development of MOS Transistors for Radiation–Hardened Large Scale Integrated Circuits and Analysis of Radiation–Induced Degradation," *Journal of Nuclear Science and Technology 31*(1):24–33, 1994.

Neumeier and Bruemmer, "Radiation Hard LOCOS Field Oxide," *IEEE Transactions on Nuclear Science 41*(3):572–576, 1994.

Neumeier and Seegebrecht, "Radiation Tolerance of Double Layer Field Oxides," *IEEE Transactions on Nuclear Science,* 1992.

*Primary Examiner*—Ngân V. Ngô
*Attorney, Agent, or Firm*—Dorsey & Whitney LLP

[57] ABSTRACT

A field emission display includes a substrate, a plurality of emitters formed on the substrate, a semiconductor device formed in or on the substrate for controlling the flow of electrons to the emitters and a dielectric layer formed on the substrate. An extraction grid is formed on the dielectric layer substantially in a plane of tips of the plurality of emitters and includes openings each surrounding one of the emitters. The display also includes a transparent viewing screen, a transparent conductor formed on the viewing screen and a cathodoluminescent layer formed on the transparent conductor. The semiconductor device includes a gate dielectric and a field oxide. Significantly, the field oxide includes an interfacial region acting as a trapping and recombination site for mobile charge carriers. As a result, the semiconductor device is more robust and is better able to resist parameter shifts or performance degradation due to exposure to X-rays and photons that are incidentally generated along with the desired images on the display. This results in a more robust field emission display.

33 Claims, 4 Drawing Sheets

DOUBLE FIELD OXIDE IN FIELD EMISSION DISPLAY AND METHOD

GOVERNMENT RIGHTS

This invention was made with government support under Contract No. DABT63-93-C-0025 awarded by Advanced Research Projects Agency (ARPA). The government has certain rights in this invention.

TECHNICAL FIELD

This invention relates in general to field emission displays for electronic devices and, in particular, to an improved field oxide structure for radiation hardening of active matrix field emission displays.

BACKGROUND OF THE INVENTION

FIG. 1 is a simplified side cross-sectional view of a portion of a field emission display 10 including a faceplate 20 and a baseplate 21 in accordance with the prior art. FIG. 1 is not drawn to scale. The faceplate 20 includes a transparent viewing screen 22, a transparent conductive layer 24 and a cathodoluminescent layer 26. The transparent viewing screen 22 supports the layers 24 and 26, acts as a viewing surface, and forms a hermetically sealed package between the viewing screen 22 and the baseplate 21. The viewing screen 22 may be formed from glass. The transparent conductive layer 24 may be formed from indium tin oxide. The cathodoluminescent layer 26 may be segmented into pixels yielding different colors to provide a color display 10. Materials useful as cathodoluminescent materials in the cathodoluminescent layer 26 include $Y_2O_3$:Eu (red, phosphor P-56), $Y_3(Al, Ga)_5O_{12}$:Tb (green, phosphor P-53) and $Y_2(SiO_5)$:Ce (blue, phosphor P-47) available from Osram Sylvania of Towanda Pa. or from Nichia of Japan.

The baseplate 21 includes emitters 30 formed on a planar surface of a substrate 32. The substrate 32 is coated with a dielectric layer 34. In one embodiment, this is effected by deposition of silicon dioxide via a conventional TEOS process. The dielectric layer 34 is formed to have a thickness that is approximately equal to or just less than a height of the emitters 30. This thickness may be on the order of 0.4 microns, although greater or lesser thicknesses may be employed. A conductive extraction grid 38 is formed on the dielectric layer 34. The extraction grid 38 may be, for example, a thin layer of polysilicon. An opening 40 is created in the extraction grid 38 having a radius that is also approximately the separation of the extraction grid 38 from the tip of the emitter 30. The radius of the opening 40 may be about 0.4 microns, although larger or smaller openings 40 may also be employed.

Another dielectric layer 42 is formed on the extraction grid 38. A chemical isolation layer 44, such as titanium, is formed on the dielectric layer 42. A high atomic mass layer 46, such as tungsten, is formed on the chemical isolation layer 44 for reasons that will be explained below.

The baseplate 21 may also include a drive field effect transistor ("FET") 50 formed in or on the surface of the substrate 32 for controlling the supply of electrons to the emitter 30. The FET 50 includes an n-tank 52 formed in the surface of the substrate 32 beneath the emitter 30. The n-tank 52 serves as a drain for the FET 50. The n-tank may be formed by a conventional masking and ion implantation process. The FET 50 also includes a source 54 and a gate 56 separated from the substrate 32 by a gate dielectric 57 and a field oxide layer 58. The opening 40 in the high atomic mass layer 46 is typically about 10 microns in diameter, while the n-tank 52 is typically about 13 microns in diameter. The emitter 30 is typically about a micron tall, and several (e.g., four or five) emitters 30 are included together with each n-tank 52, although only one emitter 30 is illustrated.

The substrate 32 may be formed from p-type silicon material having an acceptor concentration $N_A$ ca. $1\text{–}5\times10^{15}/cm^3$, while the n-tank 52 may have a surface donor concentration $N_D$ ca. $1\text{–}2\times10^{16}/cm^3$.

In operation, the extraction grid 38 is biased to a voltage on the order of 100 volts, although higher or lower voltages may be used, while the substrate 32 is maintained at a voltage of about zero volts. Signals coupled to the gate 56 of the FET 50 turn the FET 50 on, allowing electrons to flow from the source 54 to the n-tank 52 and thus to the emitter 30. Intense electrical fields between the emitter 30 and the extraction grid 38 then cause emission of electrons from the emitter 30. A larger positive voltage, ranging up to as much as 5,000 volts or more but generally 2,500 volts or less, is applied to the faceplate 20 via the transparent conductive layer 24. The electrons emitted from the emitter 30 are accelerated to the faceplate 20 by this voltage and strike the cathodoluminescent layer 26. This causes light emission in selected areas, i.e., those areas adjacent to where the FETs 50 are conducting, and forms luminous images such as text, pictures and the like.

When the electrons strike the cathodoluminescent layer 26, they also cause soft X-rays to be emitted along with the visible photons. The high atomic mass layer 46 prevents other circuitry (not illustrated) that may be formed on the substrate 32, such as those that might drive the gate of the FET 50 from being exposed to penetrating radiation, such as X-rays generated from electron bombardment of the cathodoluminescent layer 26.

The high atomic mass layer 46 also may act as an electron lens, distorting the image created by the emitted electrons when it is too close to the emitter 30. Additionally, when the high atomic mass layer 46 is close to the extraction grid 38, particulate contamination can result in a short circuit between these two layers and cause catastrophic device failure. As a result, the edge of the opening 40 in the high atomic mass layer 46 is located above the middle of the gate 56 and the field oxide 58. At least some portions of the field oxide 58 cannot be shielded by the high atomic mass layer 46 from the X-rays and photons that are generated by the electrons striking the cathodoluminescent layer 26. Penetrating radiation, such as soft X-rays, gives rise to mobile charges, i.e., electron-hole pairs, when the radiation is incident on dielectric materials, such as gate dielectrics. The electrons that are generated are generally much more mobile than the accompanying holes. The electrons are thus able to respond to the high electric fields and migrate towards the n-tank 52 and emitter 30, leaving the holes trapped in the field oxide 58. The electrons at the interface influence the threshold voltage and transconductance of the FET 50 and may render the FET 50 totally inoperative. As negative charge builds up in the interface of the field oxide 58 and the silicon material, the drive FET 50 becomes progressively more leaky and eventually cannot be turned off.

Typical FET gate or field oxides can be made more robust by diffusing species such as fluorine and nitrogen into the gate or field oxides. These species act as recombination centers and/or as electron traps for radiation-induced charge carriers in oxides. However, the FETs 50 needed for active addressing of emitters 30 require that the field oxide 58 be generally much thicker than a typical field oxide, rendering this approach impractical or impossible.

What is needed is a way to render thicker oxides more robust to radiation damage for use in emitter drive FETs for field emission displays.

SUMMARY OF THE INVENTION

In accordance with one aspect of the invention, a field emission display includes a substrate, a plurality of emitters formed on the substrate, a semiconductor device formed in or on the substrate for controlling the flow of electrons to the emitters, and a dielectric layer formed on the substrate. The display also includes an extraction grid formed substantially in a plane of tips of the plurality of emitters. The extraction grid includes openings each surrounding one of the emitters. The display also includes a transparent viewing screen, a transparent conductor formed on the viewing screen and a cathodoluminescent layer formed on the transparent conductor.

The semiconductor device includes a field oxide. Significantly, the field oxide includes an interfacial region acting as a trapping and recombination site for mobile charge carriers. As a result the semiconductor device is more robust and is better able to resist parameter shifts or performance degradation due to exposure to the soft X-rays. This results in a more robust field emission display.

DETAILED DESCRIPTION OF THE INVENTION

Figure 1:
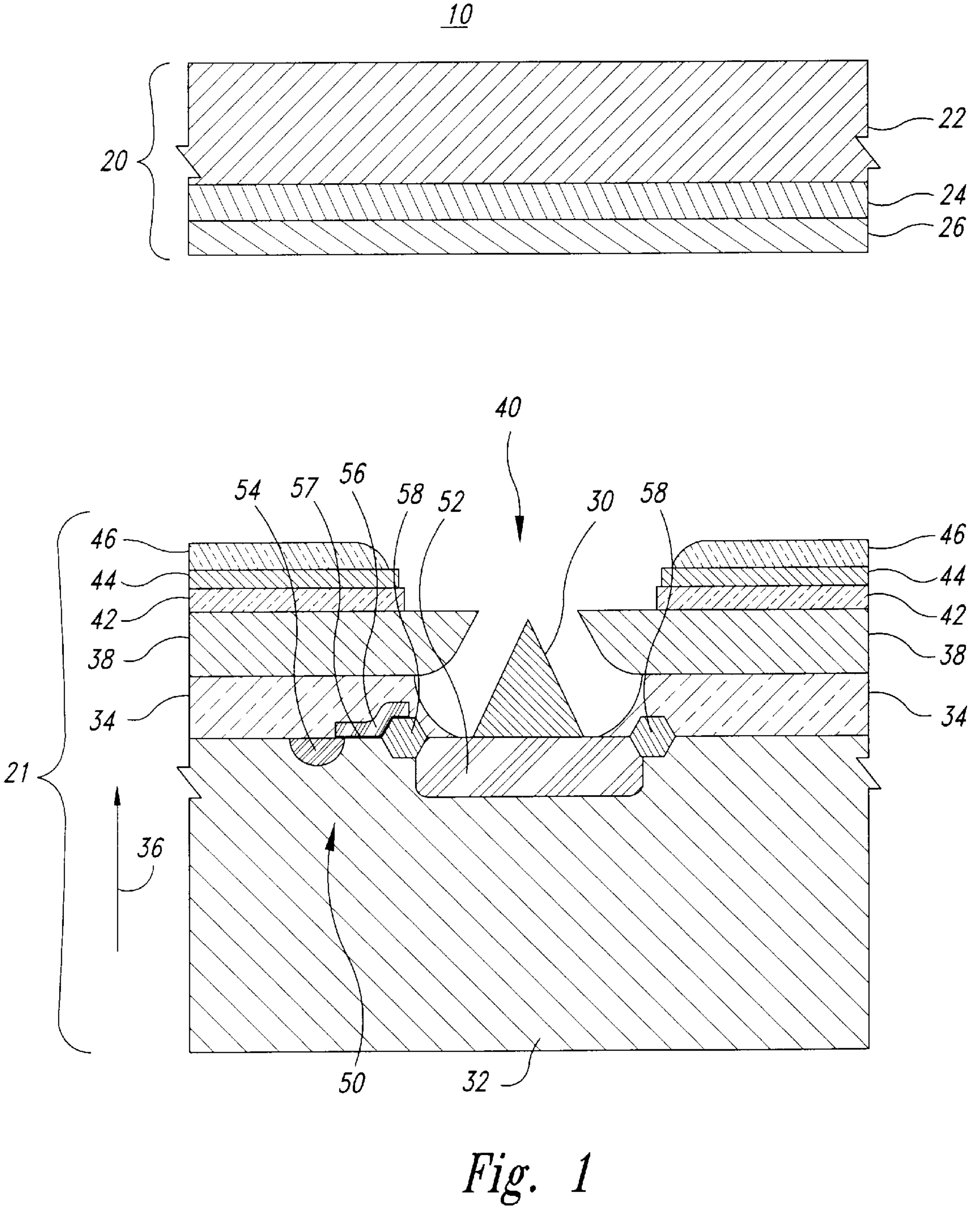
Fig. 1 (PRIOR ART)
FIG. 1 is a simplified side cross-sectional view of a portion of a display including a faceplate and a baseplate in accordance with the prior art.
Figure 2:
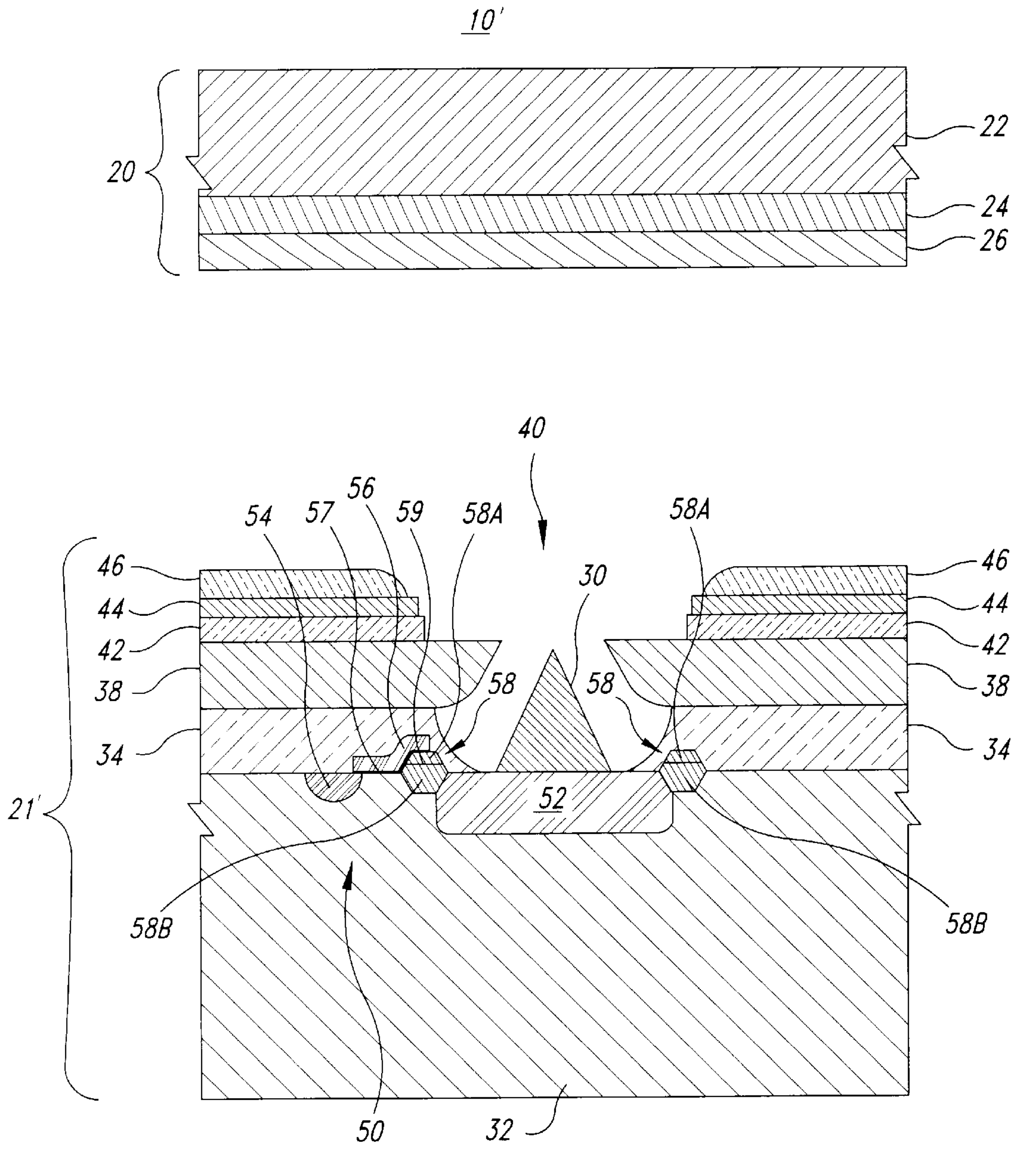
FIG. 2 is a simplified side cross-sectional view of a portion of a field emission device according to an embodiment of the present invention.

FIG. 2 is a simplified side cross-sectional view of a portion of a field emission display 10' according to an embodiment of the present invention. Many of the components used in the display 10' shown in FIG. 2 are identical to components used in the display 10 of FIG. 1. Therefore, in the interest of brevity, these components have been provided with the same reference numerals, and an explanation of them will not be repeated.

As explained above, the FET 50 formed in the baseplate 21 of the display 10 of FIG. 1 includes the gate dielectric 57 and the field oxide 58 separating the gate 56 from the substrate 32. The display 10' of FIG. 2 differs from the display 10 of FIG. 1 in that the FET 50 used in the display 10' of FIG. 2 has a field oxide that is divided into a top portion 58A and a bottom portion 58B. An interface 59 having recombination centers or traps for electrons or holes is located between the top and bottom portions 58A and 58B. The interface 59 traps electrons or holes from radiation-induced electron-hole pairs generated in the top portion 58A or bottom portion 58B of the field oxide 58 and prevents the electrons from reaching the n-tank 52. This avoids buildup of net positive charge due to holes trapped in the field oxide 58 and radiation hardens the top and bottom portions 58A and 58B of the field oxide. As used here, the term "radiation-hardened" refers to a device or structure such as a FET or a FET gate dielectric that has been modified to be able to function despite exposure to radiation. As used here, the term "radiation-hardened" does not include merely shielding the device or structure from radiation.

The recombination centers or traps may be the result of dangling bonds or of impurities that are introduced into the interface 59. Several different mechanisms can be employed to create the interface 59.

In one embodiment, the field oxide 58 is grown in two distinct oxidation processes to provide the top portion 58A and the bottom portion 58B. Imperfections arising from interruption of the oxidation process result in the interface 59. In this embodiment, recombination centers in the interface 59 result from dangling bonds where silicon and oxygen atoms are unable to combine to provide stoichiometric silicon dioxide. A similar effect may be obtained by growing a thermal oxide layer and following the growth of the thermal oxide layer with a layer of silicon dioxide that is deposited via, e.g., a conventional TEOS oxide deposition process.

In another embodiment, the top portion 58A is grown conventionally, but the bottom portion 58B is formed in a phosphorous-rich ambient to provide a phosphosilicate glass or PSG. The phosphorous and the interface 59 between the top and bottom portions 58A and 58B provide the recombination centers.

In yet another embodiment, the top portion 58A is grown conventionally, but the bottom portion 58B is grown in a boron-rich ambient to provide a borosilicate glass or BSG. Again, the boron and the interface 59 between the top and bottom portions 58A and 58B provide the recombination centers.

In each of these embodiments, the field oxide 58 is preferably grown to a total thickness of between fifteen hundred and seventy five hundred angstroms. In some embodiments, a thickness of about four thousand to five thousand or forty-five hundred angstroms is used. About 55% of this thickness is above the surface of the substrate 32. The top and bottom oxide layers 58A and 58B may be of nominally equal thickness or one may be thicker than the other. The top oxide layer 58A and the bottom oxide layer 58B are coextensive because the edges of both are defined by the same mask.

Figure 3:
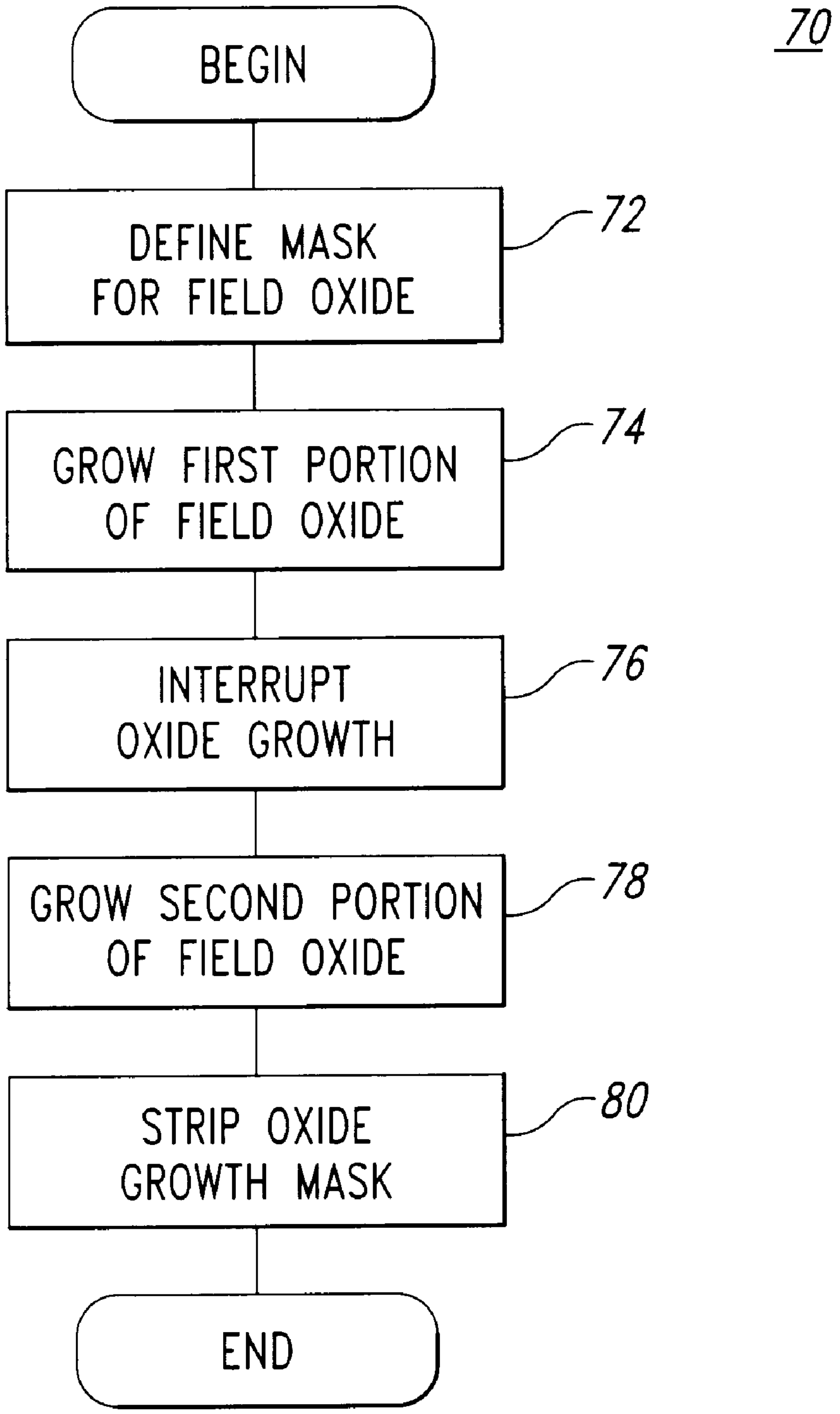
FIG. 3 is a flow chart of a process for manufacturing a robust field oxide according to an embodiment of the present invention.

FIG. 3 is a flowchart of a process 70 for forming the robust field oxide 58 including the top portion 58A and the bottom portion 58B of the field oxide 58 separated from each other by the interface 59. The substrate 32 having a plurality of the emitters 30 has been previously formed. A mask for the growth of the oxide layer 58 is defined in step 72. Typically, silicon nitride deposited by PECVD or LPCVD is used for this mask. The pattern for the oxide layer 58 is conventionally defined photolithographically. The bottom portion 58B is then grown to a thickness nominally on the order of 2,250 angstroms in step 74. Growth of the oxide layer 58 is interrupted in step 76. The top portion 58A is then grown to a thickness nominally on the order of 2,250 angstroms in step 78. Conventional oxide growth is carried out using temperatures of on the order of 1100–1200° C. in either an oxygen or steam ambient. During the second oxide growth step 78, either phosphorous or boron may be optionally introduced to provide a phosphosilicate glass or a borosilicate glass. The nitride masking layer is stripped in step 80. The process 70 then ends and the display 10' is subsequently completed via conventional fabrication steps. These steps include deposition of the dielectric layer 34 (see FIG. 1) and extraction grid 38 which cover the FET 50. Because these structures cover the FET 50, including the field oxide 58, and because of the temperatures required in order to grow the field oxide 58, deposition of the dielectric layer 34 and extraction grid 38 must take place after the process 70.

The process 70 provides a field oxide 58 that is robust even when exposed to X-rays and photons that are generated when electrons from the emitter 30 strike the cathodoluminescent layer 26. The radiation-hardened field oxide 58 in turn results in a radiation-hardened drive FET 50.

Figure 4:
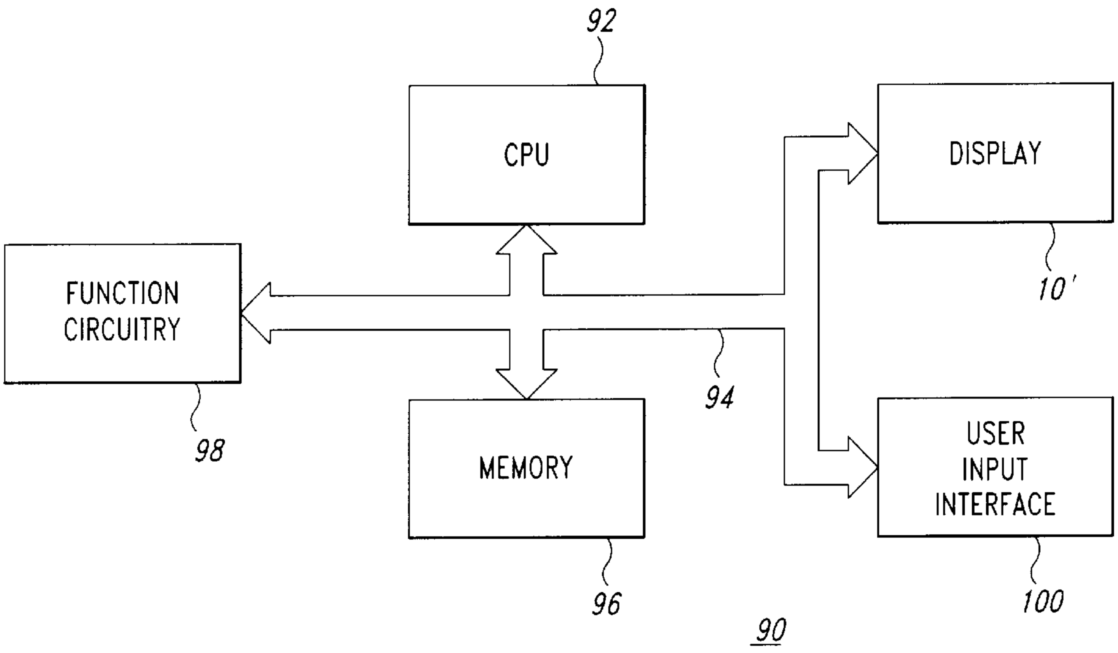
FIG. 4 is a simplified block diagram of a computer using the field oxide and drive transistor according to an embodiment of the present invention.

FIG. 4 is a simplified block diagram of a portion of a computer 90 using the display 10' fabricated as described with reference to FIGS. 2 and 3 and associated text. The computer 90 includes a central processing unit 92 coupled via a bus 94 to a memory 96, function circuitry 98, a user input interface 100 and the display 10' including the radiation-hardened portions 58A, 58B of the field oxide 58 according to the embodiments of the present invention. The memory 96 may or may not include a memory management module (not illustrated) and does include ROM for storing instructions providing an operating system and a read-write memory for temporary storage of data. The processor 92 operates on data from the memory 96 in response to input data from the user input interface 100 and displays results on the display 10'. The processor 92 also stores data in the read-write portion of the memory 96. Examples of systems where the computer 90 finds application include personal/portable computers, camcorders, televisions, automobile electronic systems, microwave ovens and other home and industrial appliances.

Field emission displays 10' for such applications provide significant advantages over other types of displays, including reduced power consumption, improved range of viewing angles, better performance over a wider range of ambient lighting conditions and temperatures and higher speed with which the display can respond. Field emission displays 10' find application in most devices where, for example, liquid crystal displays find application.

A field oxide having improved radiation resistance properties for application in a field emission display has been described. The field oxide does not require additional photolithographic steps and the field oxide manufacturing process is self-aligned. Increased radiation resistance of field oxides for field emission display emitter drive transistors results in improved useful life in field emission displays.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

What is claimed is:

1. A field emission display baseplate comprising:

a substrate;

an emitter formed on the substrate;

a semiconductor material including a p-region formed on the substrate;

a radiation-hardened FET formed in the p-region;

a dielectric layer formed on the substrate having an opening surrounding the emitter; and a conductive extraction grid formed on the dielectric layer and including an opening surrounding the emitter;

wherein the radiation-hardened FET comprises:

a drain formed in the p-region and electrically coupled to the emitter;

a bottom field oxide layer formed on the semiconductor material and extending from a boundary between the p-region and the drain onto the p-region;

a top field oxide layer formed on and coextensive with the bottom field oxide layer;

an interface formed between the top and bottom field oxide layers, the interface acting as a recombination center for radiation-induced electron-hole pairs produced in the top and bottom oxide layers;

a gate dielectric extending from the first edge of the field oxide onto the p-region;

a gate formed on the gate dielectric; and a source formed in the p-region near an edge of the gate dielectric, the source remote from the boundary between the p-region and the drain, the source, gate and drain forming the radiation-hardened FET.

2. The baseplate of claim 1 wherein the substrate comprises a p-type silicon substrate.

3. The baseplate of claim 1 wherein the p-region comprises a p-region having a nominal acceptor concentration of one to five times $10^{15}$ per cubic centimeter.

4. The baseplate of claim 1 wherein the top field oxide layer comprises phosphosilicate glass.

5. The baseplate of claim 1 wherein the top field oxide layer comprises borosilicate glass.

6. The baseplate of claim 1 wherein the top and bottom field oxide layers provide a combined thickness of between fifteen hundred and seventy five hundred angstroms.

7. The baseplate of claim 1 wherein the top and bottom field oxide layers provide a combined nominal thickness of between four thousand and five thousand angstroms.

8. A field emission display baseplate comprising:

a substrate;

a semiconductor region including a p-region formed on the substrate;

a radiation-hardened FET formed on the p-region; and an emitter formed on the substrate and electrically coupled to the FET, wherein the radiation-hardened FET comprises:

a drain formed in the p-region and electrically coupled to the emitter;

a bottom field oxide layer formed on the semiconductor material and extending from a first edge at a boundary between the p-region and the drain to a second edge on the p-region;

a top field oxide layer formed on and coextensive with the bottom field oxide layer;

an interface formed between the top and bottom field oxide layers, the interface acting as a recombination center for radiation-induced electron-hole pairs produced in the top and bottom field oxide layers;

a gate dielectric extending from the first edge of the field oxide onto the p-region;

a gate formed on the gate dielectric; and a source formed in the p-region near the edge of the gate dielectric, the source remote from the boundary between the p-region and the drain.

9. The baseplate of claim 8, further comprising:

a dielectric layer formed on the substrate and including an opening surrounding the emitter; and an extraction grid formed on the dielectric layer and including an opening formed surrounding the emitter.

10. The baseplate of claim 8 wherein the substrate comprises p-doped silicon having a nominal acceptor concentration of one to five times $10^{15}$ per cubic centimeter.

11. The baseplate of claim 8 wherein the radiation-hardened field oxide layer has a thickness of between four thousand and five thousand angstroms.

12. A field emission display baseplate, comprising:

a substrate;

a semiconductor region including a p-region formed on the substrate;

a radiation-hardened FET formed on the p-region;

an emitter formed on the substrate and electrically coupled to the FET;

a source formed in the p-region and separated from the drain by a radiation-hardened field oxide layer; and a gate extending over a portion of the radiation-hardened field oxide layer, the source, gate and drain forming the radiation-hardened FET;

wherein the radiation-hardened field oxide layer comprises:

a top field oxide layer; and a bottom field oxide layer, wherein an interface acting as a recombination site and trap for mobile charge is formed between the top and bottom field oxide layers.

13. The baseplate of claim 12 wherein the top field oxide layer comprises phosphosilicate glass.

14. The baseplate of claim 12 wherein the top field oxide layer comprises borosilicate glass.

15. The baseplate of claim 12 wherein the top and bottom field oxide layers provide a combined thickness of between fifteen hundred and seventy five hundred angstroms.

16. The baseplate of claim 12 wherein the top and bottom field oxide layers provide a combined nominal thickness of between four thousand and five thousand angstroms.

17. A field emission display comprising:

a baseplate comprising:

a substrate;

a semiconductor region including a p-region formed on the substrate;

a radiation-hardened FET formed on the semiconductor region; and an emitter formed on the substrate and electrically coupled to the FET; and a faceplate formed near the emitter, the faceplate comprising:

a transparent insulator;

a transparent conductive layer formed on the transparent insulator; and a cathodoluminescent layer formed on the transparent conductive layer;

wherein the radiation-hardened FET comprises:

a radiation-hardened field oxide having a first edge at a junction between the drain and the p-region and a second edge on the p-region;

a gate dielectric extending from the second edge of the field oxide into the p-region;

a gate formed on the gate dielectric; and a source formed in the p-region adjacent the gate dielectric; and wherein the radiation-hardened field oxide comprises:

a bottom oxide layer formed on the semiconductor material;

a top oxide layer formed on the bottom oxide layer;

an interface formed between the top and bottom oxide layers, the interface acting as a recombination center for radiation-induced electron-hole pairs produced in the top and bottom oxide layers.

18. The display of claim 17, further comprising:

a dielectric layer formed on the substrate and including an opening surrounding the emitter; and a conductive extraction grid formed on the dielectric layer and including an opening formed surrounding the emitter.

19. The display of claim 17 wherein the radiation-hardened field oxide has a thickness of between four thousand and five thousand angstroms.

20. The display of claim 17 wherein the top oxide layer comprises phosphosilicate glass.

21. The display of claim 17 wherein the top oxide layer comprises borosilicate glass.

22. The display of claim 17 wherein the top and bottom oxide layers provide a combined nominal thickness of between four thousand and five thousand angstroms.

23. A computer system, comprising:

a central processing unit;

a memory coupled to the central processing unit, the memory including a ROM storing instructions providing an operating system for the central processing unit and including a read-write memory providing temporary storage of data;

an input device; and a display the display comprising:

a baseplate comprising:

a substrate;

a semiconductor region including a p-region formed on the substrate;

a radiation-hardened FET formed on the semiconductor region;

an emitter formed on the substrate and electrically coupled to the FET;

a dielectric layer formed on the substrate and including an opening surrounding the emitter; and a conductive extraction grid formed on the dielectric layer and including an opening formed surrounding the emitter; and a faceplate comprising:

a transparent insulator;

a transparent conductive layer formed on the transparent insulator; and a cathodoluminescent layer formed on the transparent conductive layer;

wherein the radiation-hardened FET comprises:

a drain formed in the p-region;

a radiation-hardened field oxide having a first edge at a junction between the drain and the p-region and a second edge on the p-region;

a gate dielectric extending from the second edge of the field oxide onto the p-region;

a gate formed on gate dielectric; and a source formed in the p-region adjacent the gate dielectric; and wherein the radiation-hardened field oxide further comprises:

a bottom oxide layer formed on the semiconductor material;

a top oxide layer formed on and coextensive with the bottom oxide layer; and an interface formed between the top and bottom oxide layers, the interface acting as a recombination center for radiation-induced electron-hole pairs produced in the top and bottom oxide layers.

24. The computer of claim 23 wherein the radiation-hardened field oxide has a thickness of between four thousand and five thousand angstroms.

25. The computer of claim 23 wherein the top oxide layer comprises phosphosilicate glass.

26. The computer of claim 23 wherein the top oxide layer comprises borosilicate glass.

27. The computer of claim 23 wherein the top and bottom oxide layers comprise a combined nominal thickness of between four thousand and five thousand angstroms.

28. A method of making a display, comprising:

forming a semiconductor region including a p-region on a substrate;

forming a radiation-hardened FET on the semiconductor region;

forming an emitter on the substrate and electrically coupled to the FET;

forming a dielectric layer on the substrate, the dielectric layer including an opening surrounding the emitter;

forming a conductive extraction grid on the dielectric layer, the extraction grid including an opening formed surrounding the emitter; and forming a faceplate including a transparent insulator, a transparent conductive layer formed on the transparent insulator and a cathodoluminescent layer formed on the transparent conductive layer, wherein forming the radiation-hardened FET includes forming a radiation-hardened field oxide including:

forming a bottom oxide layer on the semiconductor material;

forming a top oxide layer on the bottom oxide layer; and forming an interface between the top and bottom oxide layers, the interface acting as a recombination center for radiation-induced electron-hole pairs produced in the top and bottom oxide layers.

29. The method of claim 28 wherein forming a radiation-hardened FET, further comprises:

forming a drain in the p-region;

forming the radiation-hardened field oxide to have a first edge at a junction between the drain and the p-region and a second edge on the p-region;

a gate dielectric extending from the second edge of the field oxide onto the p-region;

forming a gate on the gate dielectric; and forming a source in the p-region adjacent the gate dielectric.

30. The method of claim 28 wherein forming the radiation-hardened field oxide comprises forming the radiation-hardened field oxide to have a thickness of between four thousand and five thousand angstroms.

31. The method of claim 28 wherein forming the top oxide layer comprises forming a top oxide layer including phosphosilicate glass.

32. The method of claim 28 wherein forming the top oxide layer comprises forming a top oxide layer including borosilicate glass.

33. The method of claim 28 wherein forming the top and bottom oxide layers comprises forming the top and bottom oxide layer to provide a combined nominal thickness of between four thousand and five thousand angstroms.

* * * * *